United States Patent [19]

Bartelink

[11] Patent Number: 5,457,344
[45] Date of Patent: Oct. 10, 1995

[54] TEST FIXTURES FOR C4 SOLDER-BUMP TECHNOLOGY

[76] Inventor: Dirk J. Bartelink, 13170 La Cresta Dr., Los Altos Hills, Calif. 94022

[21] Appl. No.: 218,098

[22] Filed: Mar. 25, 1994

[51] Int. Cl.⁶ ................................................ H01L 29/04
[52] U.S. Cl. .................... 257/737; 257/276; 257/522; 257/669; 257/778; 257/785
[58] Field of Search .................... 257/688, 673, 257/674, 669, 773, 778, 735, 785, 747, 669, 522, 415, 276, 178, 48, 690, 776; 437/216; 439/66, 69

[56] References Cited

U.S. PATENT DOCUMENTS

| | | | |
|---|---|---|---|
| 4,615,573 | 10/1986 | White et al. | 439/66 |
| 4,949,148 | 8/1990 | Bartelink | 257/785 |
| 5,086,337 | 2/1992 | Noro et al. | 257/692 |
| 5,189,505 | 2/1993 | Bartelink | 257/774 |
| 5,250,847 | 10/1993 | Baskett | 257/773 |

*Primary Examiner*—Robert P. Limanek
*Assistant Examiner*—Mark S. Tremblay

[57] ABSTRACT

A two-level metal connector having only one via level accommodates motion due to thermal expansion and manufacturing tolerances by decoupling vertical and lateral freedom of motions. The lateral motion from thermal expansion is small but strong, whereas the vertical motion is much larger because the connection must accommodate manufacturing tolerances of the solder bumps over the area of the die. By separating the horizontal and vertical displacements through a laterally-free anchor and flexible bridge, the height of the anchor may be made quite shallow while maintaining a comparatively large vertical distance for a probe tip to travel. Since the substrate is merely for structural support, the two-level metal connector can be placed over any substrate including one that already has many layers of metal.

12 Claims, 12 Drawing Sheets

TEST FIXTURES FOR C4 SOLDER-BUMP TECHNOLOGY

FIELD OF THE INVENTION

The present invention relates to integrated circuits and, more specifically, to flexible chip to substrate attachments for flip chip dice. The invention provides an attachment that can absorb thermal expansion stress particularly when used in multi-chip module carriers and provides good electrical contact to solder bumps or contact pads when used as a text fixture.

BACKGROUND OF THE INVENTION

As feature sizes of integrated circuits (ICs) shrink, functionality traditionally found on a printed circuit board can be placed onto a single die. Currently, I/O signals, which electrically connect the die to other components, are reached through contacts surrounding the circuit on the die. The number of I/O signals is physically limited by the perimeter of the die. A widely practiced way to increase the number of available I/O signals is to use flip-chip methodology for packaging, where an array of contacts is positioned on the circuit face of the die and the die is mounted circuit face down upon a single chip or multi-chip module carrier. Flip-chip technology makes efficient use of otherwise unused area.

One method of flip-chip attachment is controlled collapsed chip connection pads (C4), pioneered by the International Business Machines Corp. (IBM) during the 1960s. An array of solder bumps corresponding to the array of contacts connects the flipped die to the multi-chip module carrier. The single chip or multi-chip structure may subsequently be packaged and mounted on a printed circuit board.

Dice destined for flip-chip attachment challenge prevailing test methodologies: full functional and at-speed. During full functional testing, the operation of the unpackaged die is evaluated while testing at-speed determines the operation of the die along with parasitic delays introduced by packaging and wiring. Current test fixtures are best suited for testing I/O signals positioned at the perimeter of the die. For flip-chip dice, these fixtures fail as all of the contact pads or solder bumps cannot be reached simultaneously without an elaborate fixture.

The delicate character of the solder bumps further complicates array testing. Solder bumps are very soft and extension of traditional probing techniques results in deformed bumps. Although the bumps can be reshaped after testing, this amounts to an unnecessary and hazardous expense. The reshaping or reflow process subjects the dice to a heating step that can injure the operation and performance of the IC.

One solution to avoid deforming the solder bumps is using cantilever shaped probe tips. The sharp probe tips provide connections that have low resistance and inductance at higher frequencies. The power/ground supplies are provided with nearby capacitive decoupling. However, the number of rows of probe tips is physically limited by the length of the probe tip. At best, as only four rows of the C4 array can be tested simultaneously, the design of the IC must be carefully planned so that a partitioned test methodology may be used. Furthermore, with a cantilever probe, horizontal deflection, a highly desirable feature that forms a good electrical contact with the solder bump by removing native oxide, cannot be controlled.

An alternate solution is a test fixture made of an array of tungsten probe tips or pogo pins and wires, such as the Cobra probe by IBM. Although the IC can be tested, the wires are unreliable and quite costly when hundreds of probe tips are needed. Furthermore, the probes deform the delicate solder bumps and the electrical models are too complex.

Other solutions include flexible membranes containing mask fabricated tips as probes. These tips lose their flexibility when multiple levels of interconnect are added. These additional connector layers are needed to test ICs operating at speeds greater than 200 MHz but render ineffective the traditional membrane probes. In addition, since the membranes cannot support discrete capacitors necessary for at-speed testing, the bypass capacitors must be remotely positioned.

Applying solder bumps to chip to carrier connections introduces a new complication during operation. Each time a die is power cycled, thermal stress is applied to the chip connection. Differential thermal expansion results when there is a material mismatch or a temperature difference between components of similar materials. Solder bumps have about a 1% freedom to be laterally distended and must be made quite tall and therefore fat. Thus the pitch of the bumps physically constrains the density of the solder bump array. Overall, this results in a shearing strain on the solder bump and may introduce subsequent reliability problems with transistors and on-chip wiring when the IC is used in operation.

SUMMARY

A two-level metal chip-to-carrier test fixture or connector having only one via level accommodates motion due to thermal expansion and manufacturing tolerances by decoupling vertical and lateral freedom of motions. The lateral motion from thermal expansion is small but strong, whereas the vertical motion is much larger as the connection must accommodate manufacturing tolerances of the solder bumps over the area of the die. By separating the horizontal and vertical displacements through a laterally-free anchor and flexible bridge, the height of the laterally-free anchor may be made relatively shallow while retaining the needed vertical movement for a probe tip. Since the substrate provides only structural support, the two-level metal connector can be placed over any substrate including one that already has many layers of metal.

DETAILED DESCRIPTION OF THE PREFERRED EMBODIMENTS

Figure 1A:
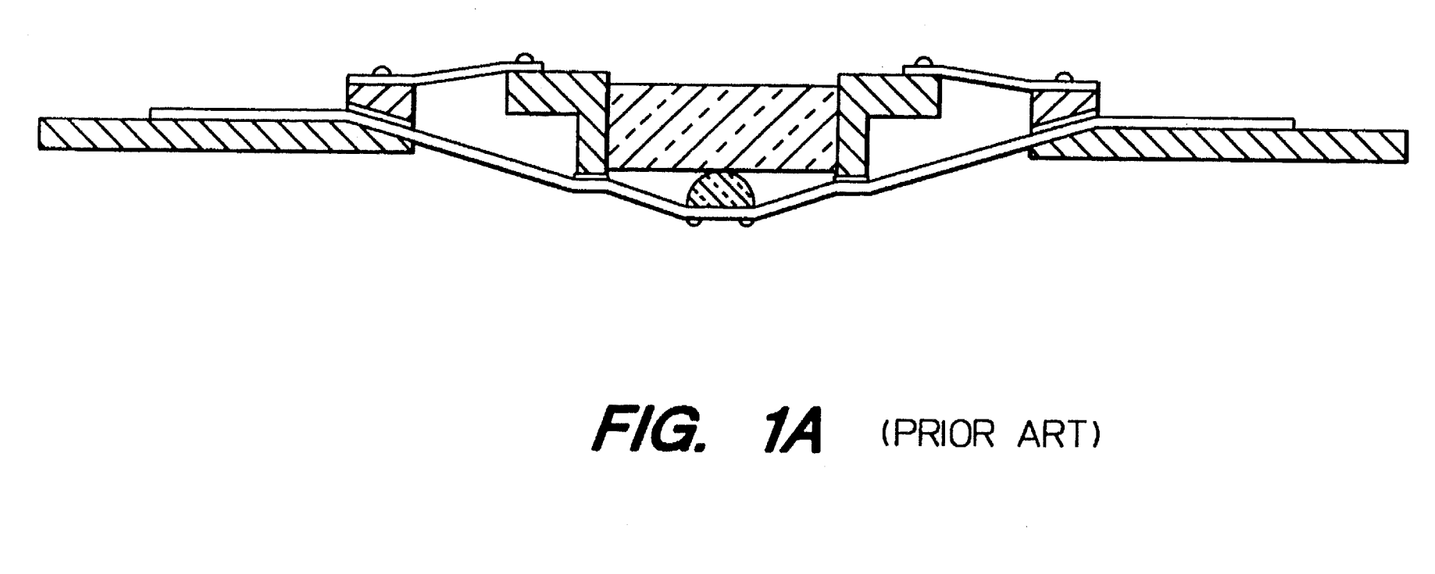
FIGS. 1A and 1B illustrate probes of the prior art.
Figure 1B:
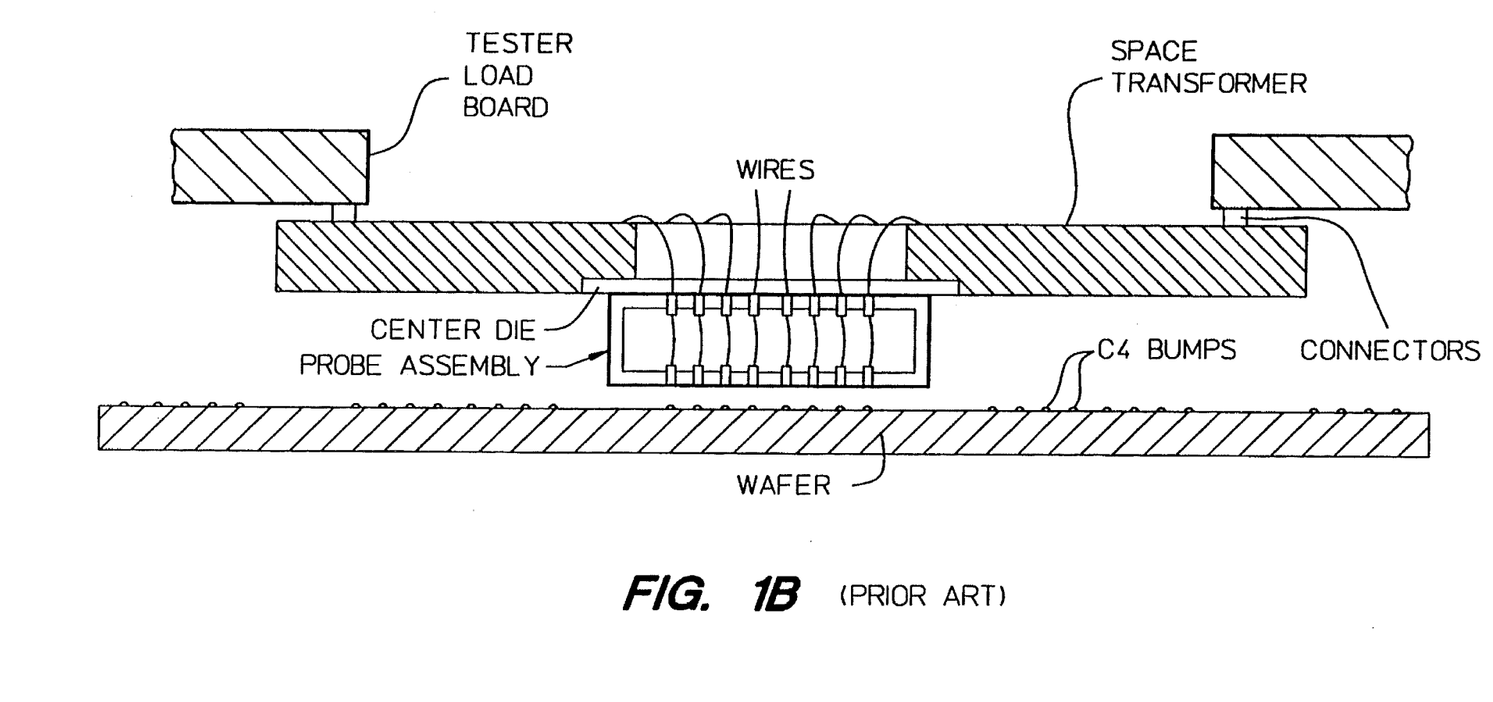

FIGS. 1A and 1B are examples of prior art probes. FIG. 1A illustrates a commonly used membrane probe. FIG. 1B illustrates a Cobra probe that is used for testing flip chips.

Figure 2:
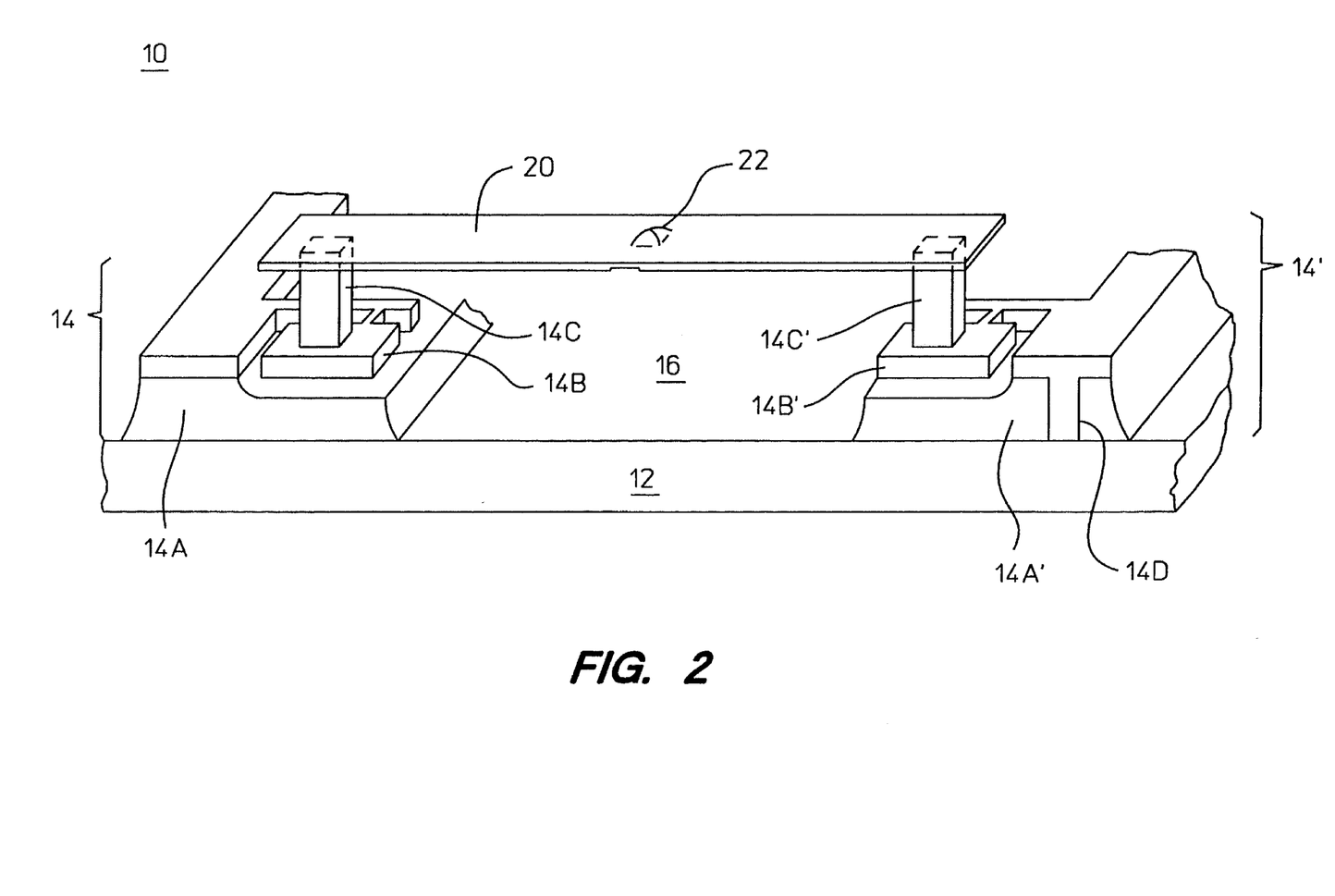
FIG. 2 illustrates a cross-sectional view of the flexible bridge.

FIG. 2 illustrates a cross-sectional view of a soft-bridge unit 10. The soft-bridge unit 10 attaches to a substrate 12. The substrate 12 may be a test fixture or a multi-chip module carrier.

Two laterally-free anchors 14, 14' are separated by a bridge cavity 16. Each anchor 14, 14' is composed of a pillar 14A, 14A' that abuts a flexible tab 14B, 14B'. The pillars 14A, 14A' are firmly anchored in the substrate. The flexible tabs 14B, 14B' are positioned at a first height above the substrate 12. Atop each flexible tab 14B, 14B' is a post 14C, 14C'. Between the posts 14C, 14C', a flexible conductive bridge 20 is positioned at a second height above the substrate 12. A probe tip 22 is positioned midway between the posts 14C, 14C' along the conductive bridge 20.

The soft-bridge unit 10 provides an electrical connection wherein the horizontal and vertical movements are decoupled. Each flexible tab 14B, 14B' acts as a support and electrical contact to the corresponding pillar 14A, 14A'. Although a desirable degree of lateral motion or contact scrubbing action can be obtained using a single laterally-free anchor, two or more laterally free anchors of suitable stiffness can provide a complete range of partially or perfectly symmetric lateral motion. The relative stiffness of the tabs 14B, 14B' controls the degree of in plane freedom of probe tip 22. The posts 14C, 14C' are forced to tilt as probe tip 22 is depressed. They are not subject to a great degree of vertical motion because the tabs 14B, 14B' may be made quite stiff with respect to the bridge 20. A wide range of vertical movement of the probe tip 22 is available when the second height is combined with the first height and the thickness of the tabs 14B, 14B'. The depth below the tabs 14B, 14B' can be made quite shallow while maintaining a large travel distance for the probe tip 22 through separation of the horizontal and vertical movements. The small amount of angular deflection available at the connection between the extended flexible tab 14B and the pillar 14A accommodates much of the vertical displacement of probe tip 22. Furthermore, increasing the heights of the posts 14C, 14C' reduces the angular deflection needed.

The substrate 12 may be any material including a semiconductor, such as silicon. Only one of the laterally-free anchors 14, 14' must be conductive. In this embodiment, the flexible tabs 14B, 14B' are made from conductive material, such as a metal or metal on dielectric, having sufficient material removed by means of cut patterns and undercut to be flexible. The pillars 14A, 14A' are made from the same conductor material overlying dielectric. The laterally-free anchors 14, 14' have been formed as an integrated unit for structural integrity. The posts 14C, 14C' are made from a metal, such as tungsten. The bridge 20 is made of dielectric material coated with a conductor, such as metal, or just metal.

When the soft-bridge unit 10 is used in a multi-chip module carrier, the mechanical fracture problem evident in conventional C4 assembly under repeated temperature cycling is overcome. Solderable pads replace or surround the tungsten probe tip 22 used in the test fixture. When the solder bumps are rigidly attached to the center of the conductive bridge 20, not only can the bridge move vertically, it can also move a small amount with an in-plane or horizontal motion to absorb thermal expansion. The laterally-free anchors 14, 14' provide a rocking movement to the posts 14C, 14C' and promote flexing of the outer portions of the conductive bridge 20.

When a via 14D is included in the anchor 14, any underlying circuitry in the multi-chip carrier and can be reached. Furthermore, as the substrate 12 of soft-bridge unit 10 is relatively rigid, capacitors for decoupling can be provided at any one of the I/O signal ports on the multi-chip carrier. These capacitors may be smaller than those used with flexible membranes since they are positioned closer to the I/O connection, with a lower inductance, instead of being placed remotely on the printed circuit board.

It will be obvious to those versed in the art that vertical freedom can be provided by one laterally-free anchor and one fixed anchor. While these embodiments provide vertical freedom of motion and scrubbing action, they do not distribute the thermal expansion stress along the bridge as effectively as the embodiment using two laterally-free anchors.

Figure 3:
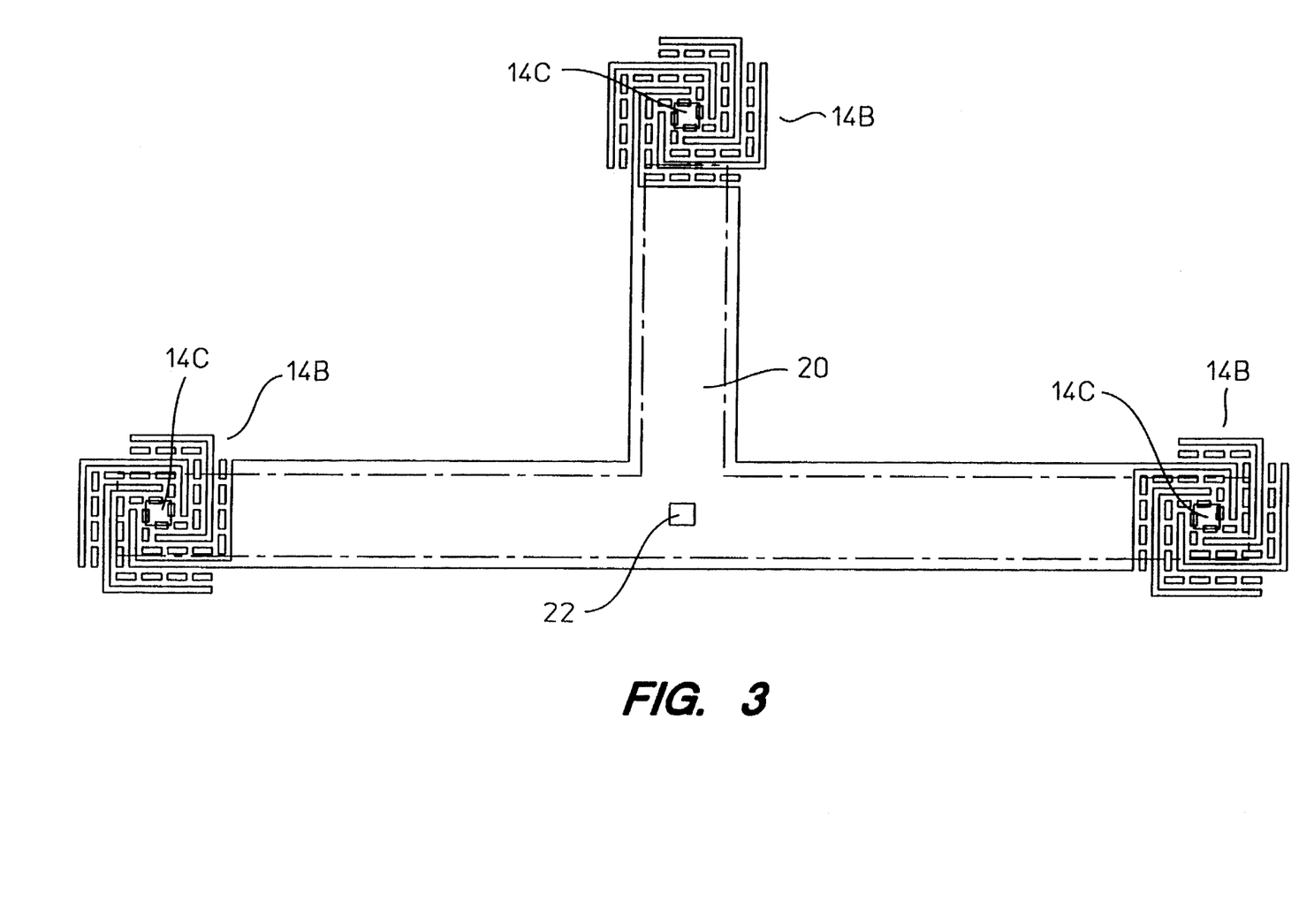
FIG. 3 is a plan view of a T-shaped embodiment.

FIG. 3 illustrates a plan view of a three-legged, T-shaped soft-bridge structure. Two soft-bridge units orthogonally intersect one another. The T-shaped embodiment provides more mechanical stability in the wiring plane by inhibiting twisting of the bridge under sideways forces. An additional leg can also be added to form a cross shaped bridge.

Figure 4A:
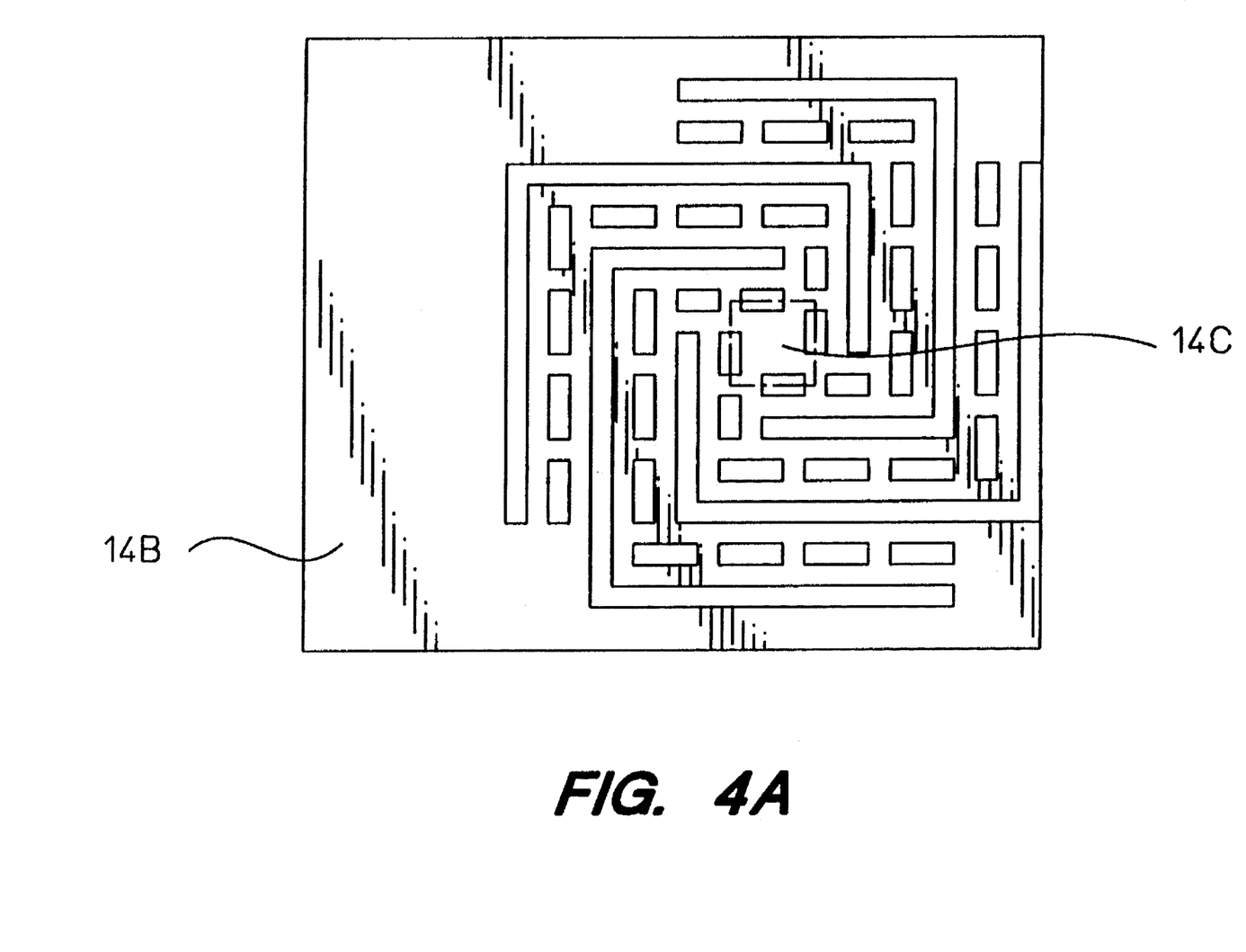
FIGS. 4A and 4B illustrate two embodiments for the flexible mesh.
Figure 4B:
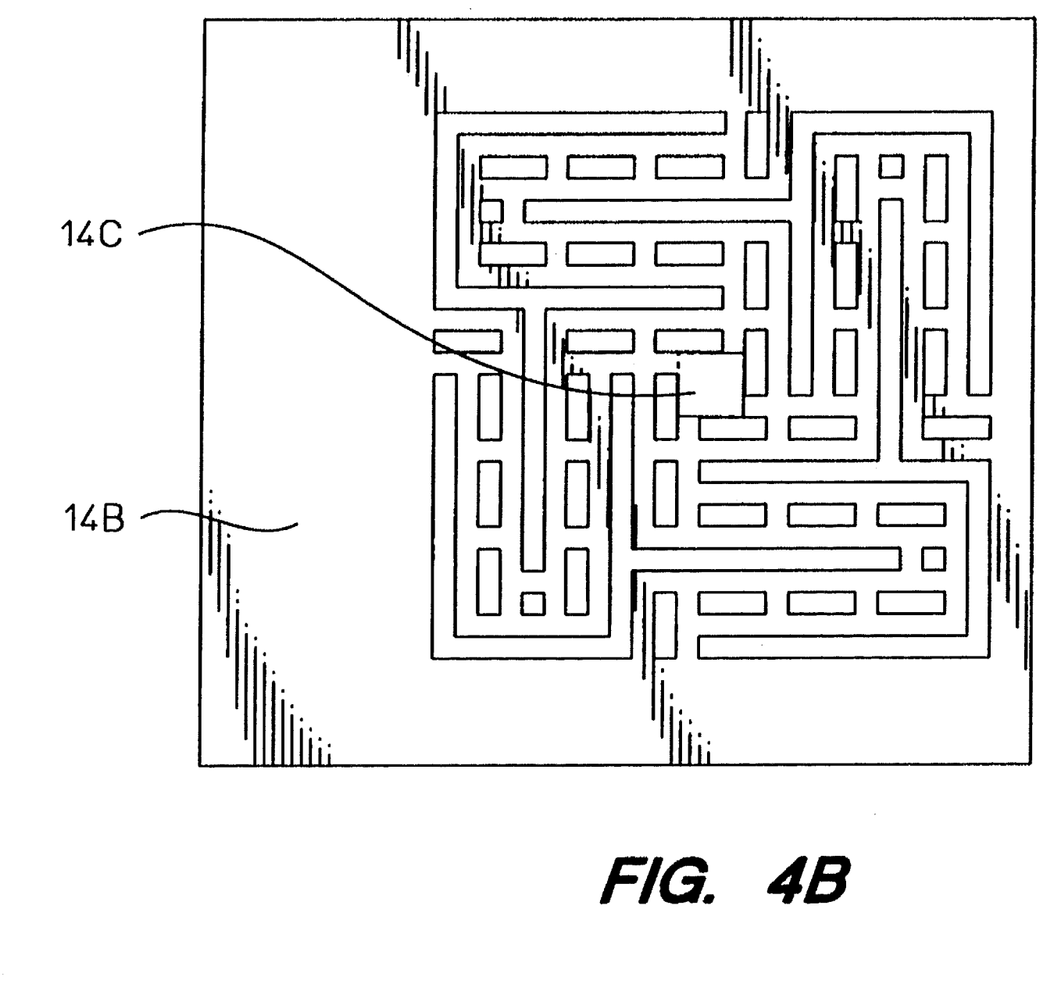

FIGS. 4A and 4B illustrate plan views of embodiments for the flexible tab shown in FIG. 2. FIG. 4A shows the flexible tab implemented as a hairpin mesh. FIG. 4B shows the flexible tab implemented as a spiral cut mesh. The amount of material that needs to be removed depends upon the rigidity and thickness of the material. In this embodiment, the flexible tab is formed by positioning metal over a layer of dielectric and etching away the desired mesh pattern. Other embodiments for the flexible tab will suggest themselves to those who are knowledgeable in the art.

Figure 5A:
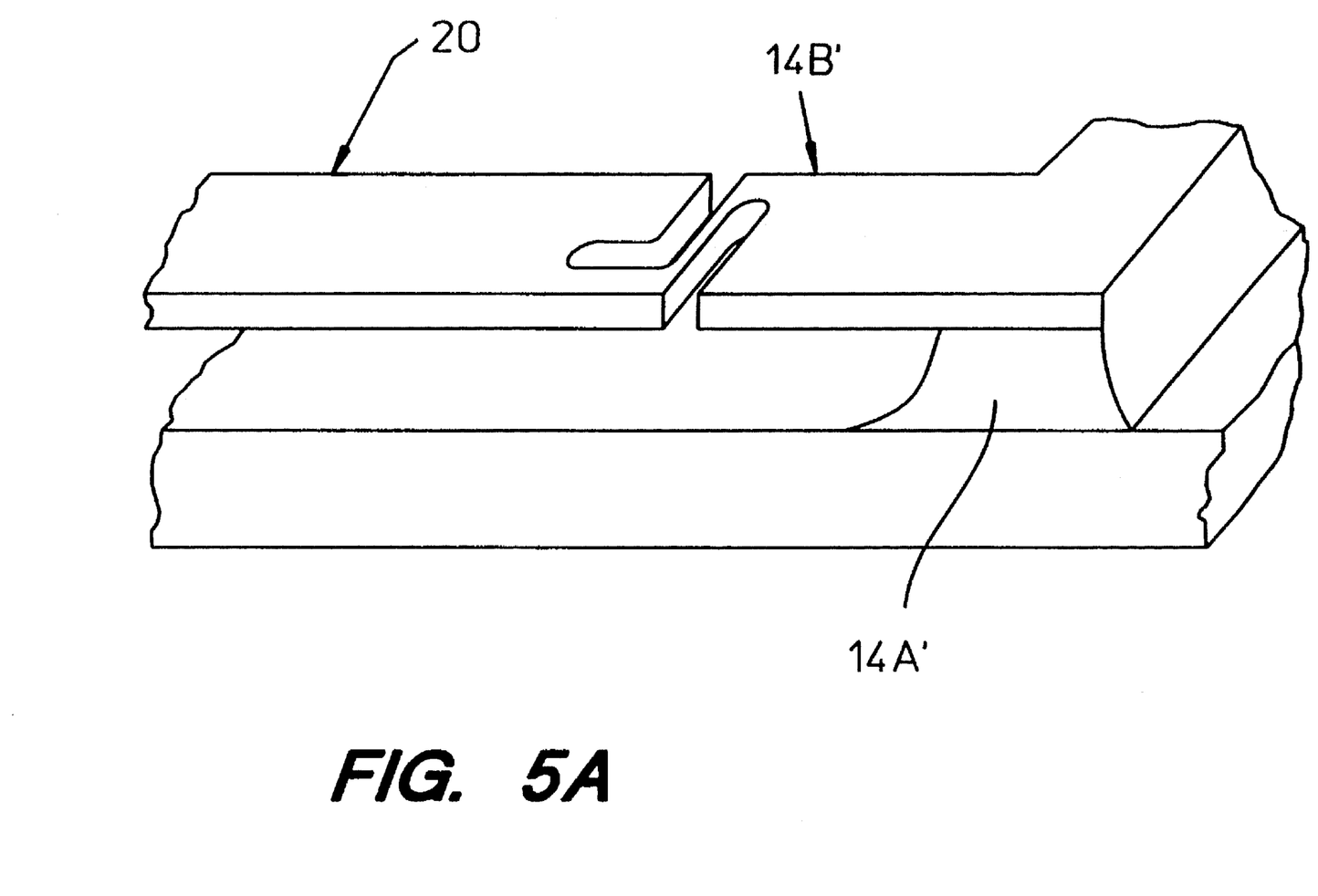
FIGS. 5A–C illustrate alternate embodiments to the post 14C shown in FIG. 2.
Figure 5B:
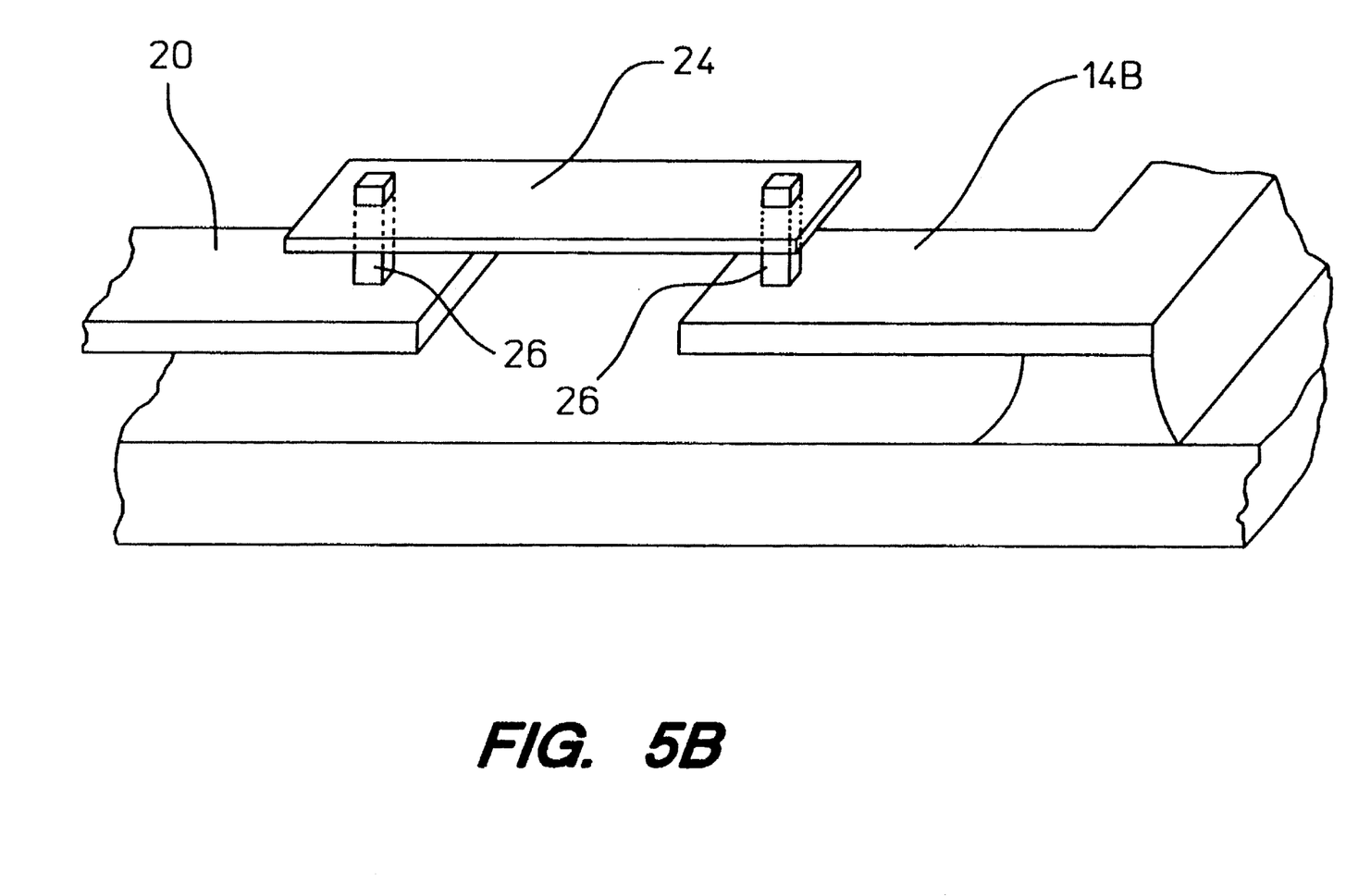
Figure 5C:
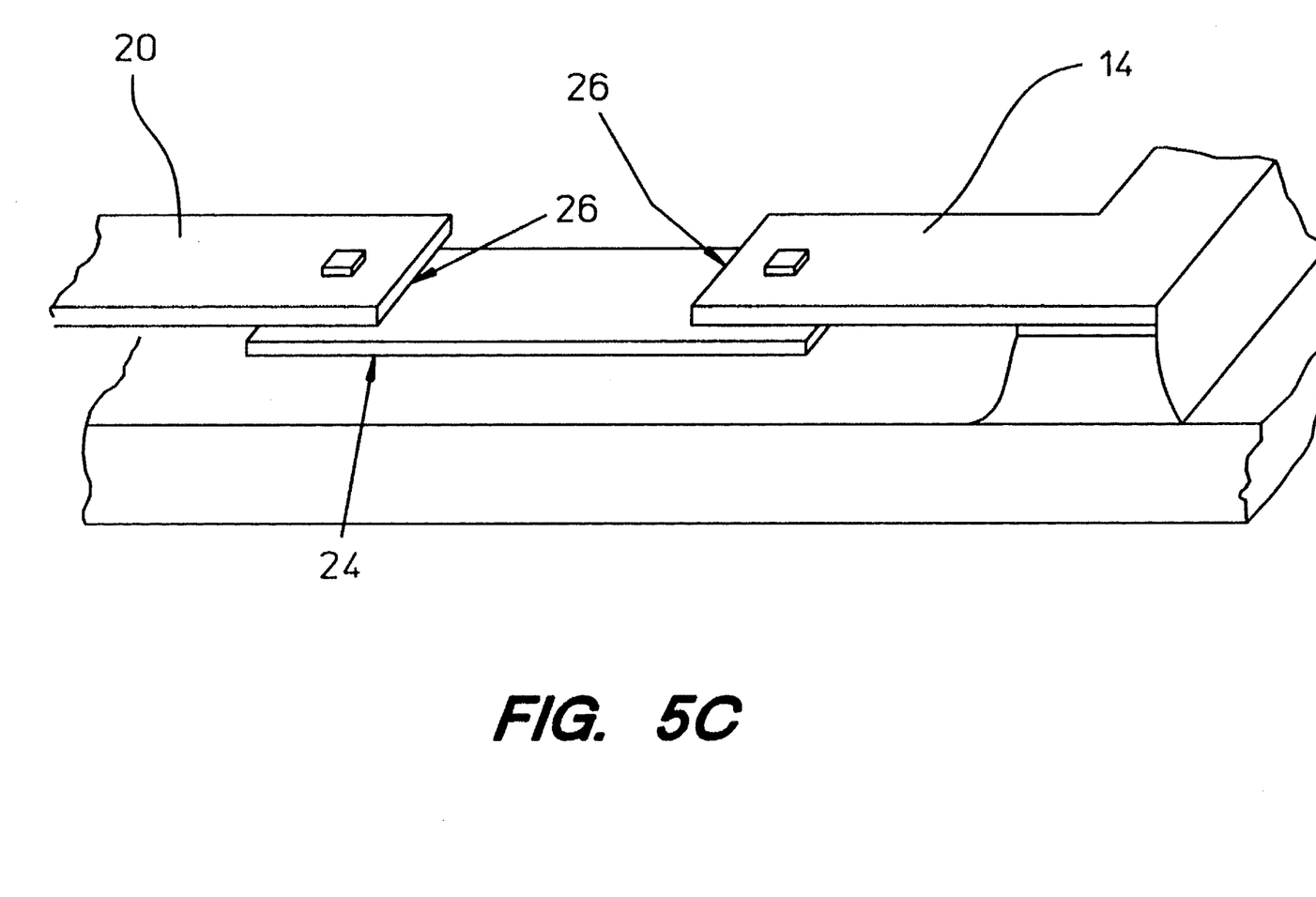

FIGS. 5A–C illustrate alternate embodiments to the post 14C shown in FIG. 2. In FIG. 5A, the conductive bridge 20 is contiguous with the flexible tabs 14B, 14B' and given in-plane flexibility by slots in the tab material. In FIG. 5B, the conductive bridge 20 is positioned contiguous with the flexible tab 14B and an in-plane flexible attachment 24 through upward located link vias 26. FIG. 5C illustrates an embodiment where the conductive bridge 20 is attached by downward located link vias 26 to the flexible tab 14B and the in-plane flexible attachment 24.

Figure 6:
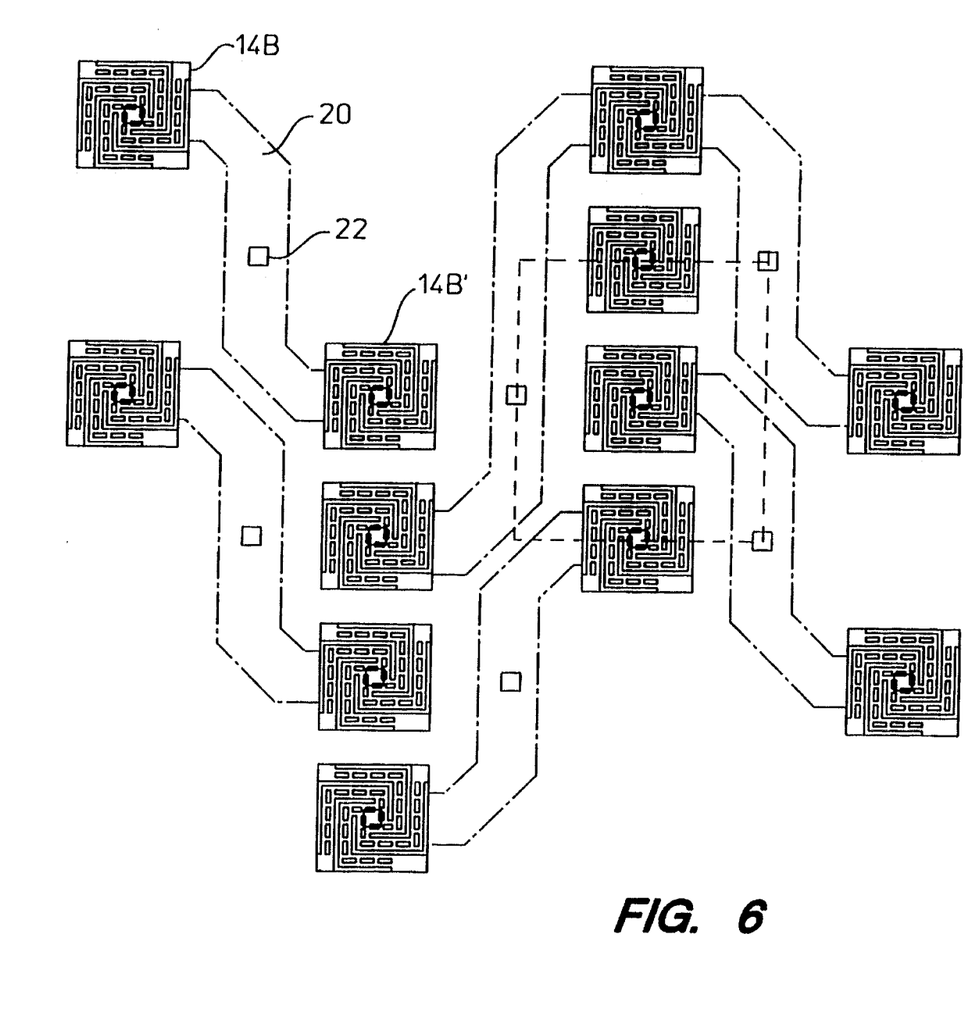
FIG. 6 illustrates a packing array of flex bridges to be used in flip chip packaging.

FIG. 6 illustrates a densely packed array of soft-bridge units that can be used for solder bump arrays. Electrical contact is made to the substrate 12 below through the pillar 14A, 14A' attached to each flexible tab 14B, 14B'. The soft-bridge units are arranged so as to be oriented at right angles in an adjacent column to provide on average an orthogonal symmetry that is similar to that of the T-shaped embodiment. Thus, the laterally-free anchors 14, 14' are offset from the columns of solder bumps by half a column width.

Figure 7:
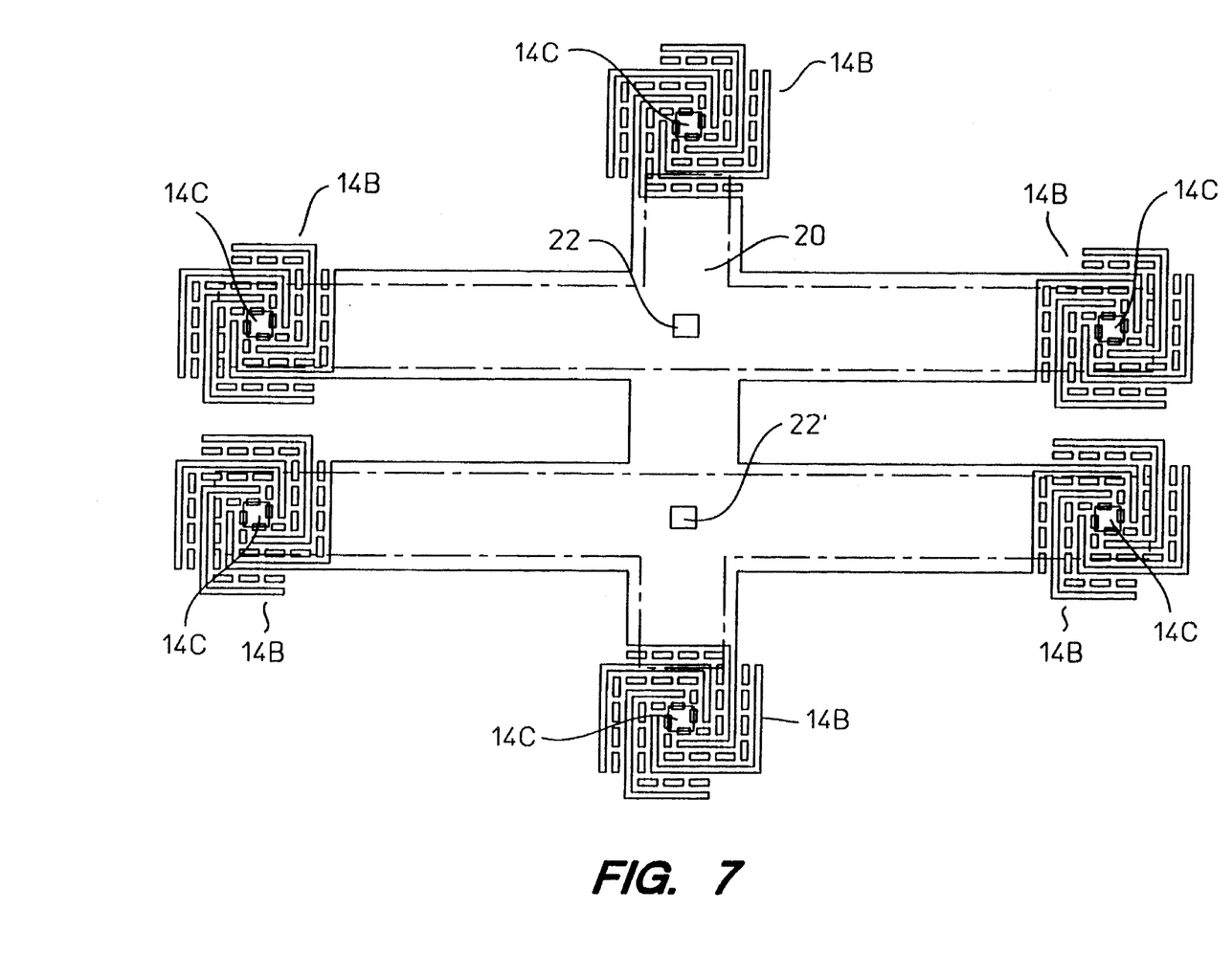
FIG. 7 illustrates an embodiment having opposing scrubbing action on a solder bump.

FIG. 7 illustrates an embodiment which improves the scrubbing action needed to contact a solder bump. In each of the T-shaped soft-bridge unit 10, 10', each of the pillars 14A, 14A', 14A" may have differing degrees of stiffness obtained through different "patterns of the flexible tab. As a result, one pillar may be soft while another pillar may be stiff in comparison. The T-soft-bridge units 10, 10' are positioned in parallel," with parallel but opposing scrubbing directions about the solder bump. Alternatively, the T-shaped bridges can be configured to cause scrubbing at right angles to their long axis, again with opposite scrubbing directions for the pair. Thus, there are two probe tips 22, 22' for each solder bump.

Figure 8A:
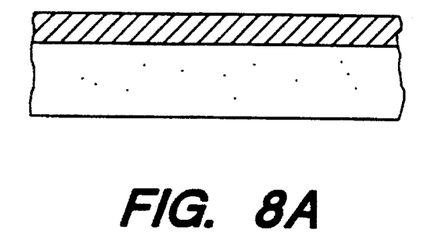
FIGS. 8A–G show unit construction of the soft-bridge unit illustrated in FIG. 2.

FIGS. 8A–G show construction stages of the soft-bridge unit illustrated in FIG. 2 using semiconductor processing techniques. In this embodiment, a multi-level metal substrate, such as a chip carrier, is selected. In FIG. 8A, the pillar material is formed by depositing a silicon dioxide layer over the substrate. Silicon dioxide is chosen for its resistance to etching of the subsequently applied sacrificial dielectric layers. Furthermore, the silicon dioxide layer must be thick enough to minimize electrical connections from parasitic capacitances to the substrate. Next, a first layer of metal is deposited over the first dielectric layer.

Figure 8B:
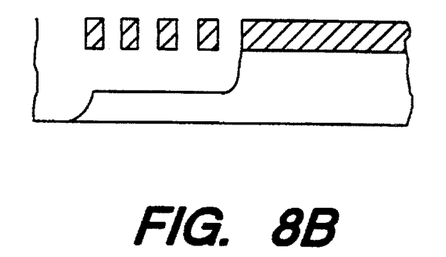

In FIG. 8B, the extended flexible tabs are formed. A tab mask containing the desired mesh patterns is etched into the first layer of metal. The feature size of the lines and spaces in the mesh pattern directly depend on processing constraints. These patterns ease the undercutting and backfilling operations to be described. Using this patterned metal layer as a mask, an anisotropic etch vertically defines the mesh pattern in the silicon dioxide layer. A subsequent isotropic etch provides sufficient undercutting to remove silicon dioxide by undercutting just over half the line width underneath the extended flexible tab. If a two micron feature size is used to allow lithography by a large field projection aligner, this undercut is 1 micron or more. The depth of the etch may vary between the large openings and under the mesh as shown.

Figure 8C:
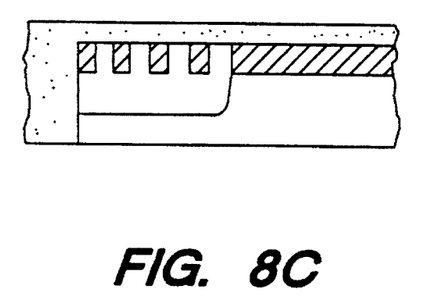

FIG. 8C shows the first step in the formation of the cavity beneath the flexible conductive bridge. First, the bridge cavity and the spaces in the mesh pattern are backfilled with a first sacrificial dielectric layer, such as spin-on polyimide. The spin-on polyimide is etched at a faster rate than the silicon dioxide layer. This step provides an even surface for subsequent processing.

Figure 8D:
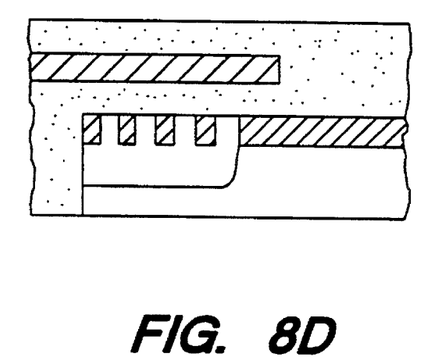

Next, the bridge and posts are fabricated. FIG. 8D shows the second step in the formation of the conductive bridge. A second layer of metal is deposited over the first sacrificial dielectric layer and patterned to form the bridge. A second sacrificial dielectric layer is positioned over the second layer of metal.

Figure 8E:
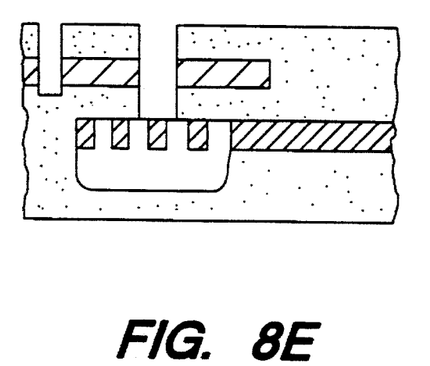
Figure 8F:
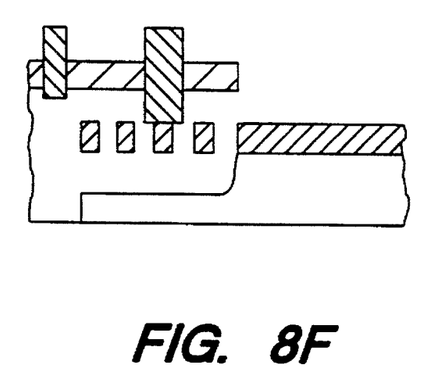

FIG. 8E illustrates the positioning of the posts and probe tips. Using a first bridge via mask, post vias are defined in the second sacrificial dielectric layer. The post vias are etched down to the first layer of metal in the tab area. With a second bridge via mask, probe tip vias are defined in the upper dielectric layer. The tip vias are etched to a desired depth in the second layer of metal. A tungsten deposition and etchback is then performed down to the second sacrificial dielectric layer thus forming the probe tips and the conductive posts. Finally, a dielectric etch is performed to remove all the sacrificial dielectric material. FIG. 8F illustrates the completed soft-bridge unit.

Figure 8G:
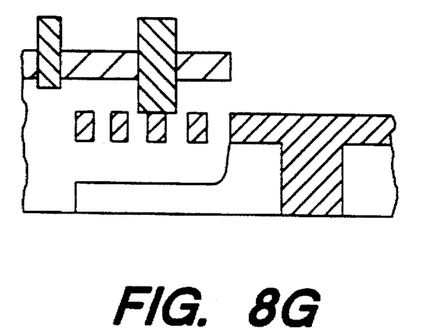

Although FIGS. 8A–F illustrate the construction of a soft-bridge unit having insulating pillars, the pillars may be made conductive by adding separate conductive vias, as shown in FIG. 8G, to contact any underlying circuitry. These vias may be fabricated prior to the deposition of the first layer of metal. For example, the silicon dioxide can be patterned and etched to form vias that act as a mold for the conductive pillars. The first layer of metal is then deposited into the vias and over the silicon dioxide layer.

The fabrication process does not rely on using the substrate for any other purpose such as flexibility other than for mechanical support. Thus, this structure can be placed over a substrate that already has many metal levels. Also, this substrate allows decoupling capacitors to be integrated at each contact pad within the C4 array.

What is claimed is:

1. A soft-bridge structure with lateral freedom for contacting at least one of an array of solder bumps comprising:
   a substrate;
   two suspension supports positioned on the substrate, each suspension support comprising:
      a pillar of dielectric material, and
      a horizontal, flexible conductive tab adjacent the pillar at a first height above the substrate;
   a first metal strip suspended between the two suspension supports at a second height above the substrate;
   two conductive connectors, each conductive connector connecting between a corresponding one of the two suspension supports and the first metal strip; and
   a first probe via positioned on the first metal strip to contact the solder bump;
   whereby the first metal strip has lateral freedom of motion when the first probe via is depressed.

2. A soft-bridge structure, as defined in claim 1, wherein the second height is equal to the first height.

3. A soft-bridge structure, as defined in claim 2, wherein the suspension supports serve as the two conductive connectors.

4. A soft-bridge structure as defined in claim 2, each of the two conductive connectors comprising:
   a first link via attached to the corresponding one of the two horizontal tabs;
   an in-plane attachment having a two ends, one end of the in-plane attachment being attached to the first link via; and
   a second link via attached between the other end of the in-plane attachment and the first metal strip;
   wherein the in-plane attachment in conjunction with the height of the first and second extension vias provide the first metal strip with lateral freedom.

5. A soft-bridge structure as defined in claim 4, wherein the first and second link vias and the in-plane attachment are positioned above the flexible tab.

6. A soft-bridge structure as defined in claim 4, wherein the first and second link vias and the in-plane attachment are positioned below the flexible tab.

7. A soft-bridge structure, as defined in claim 1, each of the two suspension supports further comprising:
   the horizontal flexible, conductive tab having material removed such that the tab is more flexible; and
   a post attached to the horizontal tab;
   wherein the post and the horizontal tab provide the first metal strip with lateral freedom.

8. A soft-bridge structure, as defined in claim 7, wherein the first metal strip connects to the posts of each of the two suspension supports such that the second height is above the first height.

9. A soft-bridge structure, as defined in claim 1, further comprising:
   the pillar of one of the two suspension supports being a stiff pillar and the pillar of the other of the two suspension supports being a soft pillar;
   a second metal strip positioned adjacent and parallel to the first metal strip at the second height;
   a second probe via positioned on the second metal strip contacting one of the array of solder bumps;
   a soft support positioned on the substrate at one end of the second metal strip and adjacent the stiff pillar;
   a stiff support positioned on the substrate at the other end of the second metal strip and adjacent the soft pillar; and
   wherein the first and second metal strips have lateral freedom of motion in opposing directions such that the first and second probe vias scrub in opposing directions.

10. A soft-bridge structure as defined in claim 9, wherein the first and second probe vias contact the same one of the array of solder bumps.

11. A soft-bridge structure, as defined in claim 1, further including:

a third suspension support positioned on the substrate in close proximity of the first metal strip;

a third strip attached between the third suspension support at the second height such that the third strip is contiguous with the first metal strip; and wherein the first probe via is positioned at an intersection of the third strip and the first metal strip such that there is vertical freedom of motion when the first probe via is depressed.

12. A soft-bridge structure, as defined in claim 11, wherein the intersection is at the midpoint of the first metal strip.

* * * * *